United States Patent
Osada et al.

(10) Patent No.: US 6,630,745 B1
(45) Date of Patent: Oct. 7, 2003

(54) SEMICONDUCTOR ENCAPSULATING EPOXY RESIN COMPOSITION AND SEMICONDUCTOR DEVICE

(75) Inventors: Shoichi Osada, Gunma-ken (JP); Eiichi Asano, Gunma-ken (JP); Shigeki Ino, Gunma-ken (JP); Takayuki Aoki, Gunma-ken (JP); Kazutoshi Tomiyoshi, Gunma-ken (JP); Toshio Shiobara, Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 09/558,384

(22) Filed: Apr. 26, 2000

(30) Foreign Application Priority Data

Apr. 26, 1999 (JP) ............................................. 11-118155
Apr. 26, 1999 (JP) ............................................. 11-118408

(51) Int. Cl.$^7$ ................................................. H01L 23/29
(52) U.S. Cl. ........................ 257/793; 428/620; 523/458; 523/459; 523/466; 524/266; 524/267; 524/268; 524/406; 525/476; 525/481
(58) Field of Search ................................ 525/491, 476; 524/406, 266, 267, 268; 523/458, 459, 466; 428/620; 257/793

(56) References Cited

U.S. PATENT DOCUMENTS

| | | | |
|---|---|---|---|
| 2,766,139 A | 10/1956 | Green et al. | |
| 3,373,135 A | 3/1968 | Jenkner et al. | |
| 3,398,019 A | 8/1968 | Langguth et al. | |
| 4,273,691 A | 6/1981 | MacLaury et al. | |
| 4,544,688 A | 10/1985 | Salensky et al. | |
| 4,632,946 A | 12/1986 | Muench et al. | |
| 4,851,481 A | * 7/1989 | Kuriyama et al. | |
| 4,902,732 A | 2/1990 | Itoh et al. | |
| 5,155,198 A | 10/1992 | Keohan | |
| 5,360,837 A | 11/1994 | Honda et al. | |
| 5,434,199 A | 7/1995 | Gallagher et al. | |
| 5,476,884 A | 12/1995 | Kayaba et al. | |
| 5,567,749 A | 10/1996 | Sawamura et al. | |
| 5,714,550 A | * 2/1998 | Shaw | ......................... 525/393 |
| 5,739,186 A | 4/1998 | Hayakawa et al. | |
| 5,985,954 A | * 11/1999 | Tsuchida et al. | ............. 257/431 |
| 6,277,908 B1 | * 8/2001 | Yamamoto | ................... 524/436 |
| 6,326,425 B1 | * 12/2001 | Itagaki et al. | ............... 524/268 |
| 6,353,046 B1 | * 3/2002 | Rosenquist et al. | ......... 524/267 |
| 6,433,049 B1 | * 8/2002 | Romenesko et al. | ........ 524/261 |
| 6,454,969 B1 | * 9/2002 | Nishihara | ................... 252/609 |

FOREIGN PATENT DOCUMENTS

| | | | |
|---|---|---|---|
| CA | 1110789 | | 10/1981 |
| EP | 272482 | | 6/1988 |
| EP | 0953603 A2 | | 11/1999 |
| GB | 1104606 | | 2/1968 |
| JP | 002155365 | | 5/1985 |
| JP | A6395249 | | 4/1988 |
| JP | A63101454 | | 5/1988 |
| JP | A63117057 | | 5/1988 |
| JP | A63275661 | | 11/1988 |
| JP | A63312349 | | 12/1988 |
| JP | 05-331263 | * | 12/1993 |
| JP | 06-080861 A | * | 3/1994 |
| JP | 11021423 A | | 1/1999 |
| JP | 2000-327883 A | * | 11/2000 |

OTHER PUBLICATIONS

Flame Retardanncy of Polymeric Materials, vol. 1, pp 24–38, pp 52–61.

* cited by examiner

Primary Examiner—Robert Dawson
Assistant Examiner—Marc S Zimmer
(74) Attorney, Agent, or Firm—Birch, Stewart, Kolasch & Birch, LLP

(57) ABSTRACT

A semiconductor encapsulating epoxy resin composition is provided comprising (A) an epoxy resin, (B) a phenolic resin curing agent, (C) a molybdenum compound, (D-i) an organopolysiloxane, (D-ii) an organopolysiloxane cured product, or (D-iii) a block copolymer obtained by reacting an epoxy resin or alkenyl group-bearing epoxy resin with an organohydrogenpolysiloxane, and (E) an inorganic filler. The composition has improved moldability and solder crack resistance while exhibiting high flame retardance despite the absence of halogenated epoxy resins and antimony oxide.

9 Claims, No Drawings

SEMICONDUCTOR ENCAPSULATING EPOXY RESIN COMPOSITION AND SEMICONDUCTOR DEVICE

This invention relates to an epoxy resin composition for semiconductor encapsulation which is effectively moldable and cures into a product having solder crack resistance, flame retardance and moisture-proof reliability. It also relates to a semiconductor device encapsulated with a cured product of the composition.

BACKGROUND OF THE INVENTION

The current mainstream in the semiconductor industry resides in diodes, transistors, ICs, LSIs and VLSIs of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. Semiconductor devices are now used in every area of the modern society, for example, in electric appliances and computers. As a guard against accidental fire, the semiconductor encapsulating materials are required to be flame retardant.

Halogenated epoxy resins (typically chlorinated and brominated epoxy resins) combined with antimony trioxide are often blended in epoxy resin compositions in order to enhance flame retardance. This combination of a halogenated epoxy resin with antimony trioxide has great radical-trapping and air-shielding effects in the vapor phase, thus conferring a high fire-retarding effect.

In a high-temperature environment, however, such flame retardants as halides (typically chlorides and bromides) and antimony compounds are decomposed to give rise to chemical reaction at connections between gold wires and aluminum lines. This results in an increased resistance at the connections or even disconnection, inviting malfunction. In addition, the halogenated epoxy resins generate noxious gases during combustion, and antimony trioxide has powder toxicity. Given their negative impact on human health and the environment, it is desirable to entirely exclude these fire retardants from resin compositions.

In view of the above demand, studies have been conducted on the use of hydroxides such as $Al(OH)_3$ and $Mg(OH)_2$ or phosphorus-containing fire retardants in place of halogenated epoxy resins and antimony trioxide. Unfortunately, because of various problems associated with the use of these alternative compounds, such as inferior curability of the resin composition during molding and poor moisture resistance in the cured product, they are not yet ready for practical application.

SUMMARY OF THE INVENTION

An object of the invention is to provide an epoxy resin composition for semiconductor encapsulation which is free of harmful halogenated epoxy resins and antimony compounds, is effectively moldable and cures into a product having improved solder crack resistance, flame retardance and reliability. Another object is to provide a semiconductor device encapsulated with a cured product of the composition.

The invention provides a semiconductor encapsulating epoxy resin composition comprising (A) an epoxy resin, (B) a phenolic resin curing agent, (C) a molybdenum compound, (D) a silicon compound, and (E) an inorganic filler. The silicon compound (D) is selected from the group consisting of (D-i) an organopolysiloxane of the following average compositional formula (1):

$$R^1_a SiO_{(4-a)/2} \tag{1}$$

wherein $R^1$ is a substituted or unsubstituted monovalent hydrocarbon group, and "a" is a positive number of 0.8 to 3, with the proviso that two $R^1$ groups, taken together, may form an alkylene group, (D-ii) a cured product of organopolysiloxane, and (D-iii) a block copolymer obtained by reacting an epoxy resin or an alkenyl group-bearing epoxy resin with an organopolysiloxane of the following average compositional formula (2):

$$H_m R^2_n SiO_{(4-m-n)/2} \tag{2}$$

wherein $R^2$ is a substituted or unsubstituted monovalent hydrocarbon group, m is a positive number of 0.001 to 0.2, n is a positive number of 1.8 to 2.1, and m+n is 1.801 to 2.3, the number of silicon atoms in a molecule is an integer of 10 to 1,000, and the number of hydrogen atoms directly attached to silicon atoms is 1 to 5, addition reaction taking place between epoxy groups on the epoxy resin or alkenyl groups on the alkenyl group-bearing epoxy resin and silicon-attached hydrogen atoms (i.e., SiH groups) on the organopolysiloxane.

The semiconductor encapsulating epoxy resin compositions of the invention are effectively molded and cure into products which have an excellent fire retardance, moisture resistance and solder cracking resistance despite the absence of halogenated epoxy resins and antimony compounds (e.g., antimony trioxide).

DETAILED DESCRIPTION OF THE INVENTION

Component (A) is an epoxy resin which is not critical as long as it has at least two epoxy groups per molecule. This epoxy resin is different from the block copolymer (D-iii) to be described later in that it does not contain a siloxane structure in the molecule. Illustrative examples of suitable epoxy resins include novolac-type epoxy resins such as phenolic novolac epoxy resins and cresol novolac epoxy resins, triphenolalkane epoxy resins such as triphenolmethane type epoxy resin and triphenolpropane type epoxy resin, phenolaralkyl epoxy resins, biphenyl skeleton-containing aralkyl epoxy resins, biphenyl epoxy resins, heterocyclic epoxy resins, naphthalene ring-containing epoxy resins, bisphenol-type epoxy resins such as bisphenol A epoxy compounds and bisphenol F epoxy compounds, and stilbene epoxy resins. Any one or combination of two or more of these epoxy resins may be employed. Halogenated epoxy resins are excluded.

No particular limit is imposed on the phenolic resin serving as curing agent (B) in the invention, so long as the phenolic resin has at least two phenolic hydroxy groups in a molecule. Illustrative examples of typical phenolic resin curing agents include novolac-type phenolic resins such as phenolic novolac resins and cresol novolac resins, naphthalene ring-containing phenolic resins, triphenolalkane phenolic resins such as triphenolmethane type phenolic resin and triphenolpropane type phenolic resin, phenolaralkyl phenolic resins, biphenyl skeleton-containing aralkyl phenolic resins, biphenyl phenolic resins, alicyclic phenolic resins, heterocyclic phenolic resins, and bisphenol-type phenolic resins such as bisphenol A and bisphenol F. Any one or combination of two or more of these phenolic resins may be employed.

The relative proportions of the epoxy resin (A) and the phenolic resin curing agent (B) used in the epoxy resin compositions are not subject to any particular limits, although it is preferred that the amount of phenolic hydroxyl groups in the curing agent (B) be from 0.5 to 1.5 moles, and especially 0.8 to 1.2 moles, per mole of epoxy groups in the epoxy resin (A).

The epoxy resin composition of the invention contains a molybdenum compound as the flame retardant (C). Exemplary molybdenum compounds are molybdenum oxides, molybdenum borides, molybdenum suicides, molybdenum esters, and molybdic salts such as molybdenum boride, molybdenum disilicide, molybdenum acetylacetonate, molybdenum (IV) oxide, molybdenum (V) oxide, molybdenum (VI) oxide, zinc molybdate, calcium molybdate carbonate, and calcium molybdate. The molybdenum compound by itself is known to have a smoke-reducing and charring effect in burning plastic. Although like antimony trioxide, molybdenum compounds are conventionally used in combination with halogenated resins, it has been found by the inventors that flame retardance is exerted by combining molybdenum compounds with the organopolysiloxane, organopolysiloxane cured product or block copolymer to be described later. Since the molybdenum compounds are free from powder toxicity as found with antimony trioxide, they are quite safe flame retardants. Of these, zinc molybdate is especially preferred since it does not affect the curability of the epoxy resin.

To achieve a satisfactory flame retardant effect, zinc molybdate must be uniformly dispersed in the epoxy resin composition. To improve the dispersibility, zinc molybdate is preferably supported on an inorganic carrier such as silica or talc. Suitable inorganic carriers for supporting zinc molybdate include silicas such as fused silica and crystalline silica, talc, alumina, silicon nitride, aluminum nitride, boron nitride, titanium oxide, and glass fibers. The zinc molybdate-carrying powder should preferably have a mean particle diameter of 0.1 to 40 μm, more preferably 0.2 to 15 μm, and most preferably 0.5 to 5 μm and a specific surface area of 0.5 to 50 m²/g, and more preferably 0.7 to 10 m²/g as measured by the BET method.

It is noted that the mean particle diameter can be determined as the weight average value (or median diameter) based on the laser light diffraction technique, for example.

In the flame retardant comprising zinc molybdate supported on the inorganic carrier, the content of zinc molybdate is preferably 5 to 40% by weight and more preferably 10 to 30% by weight. Less contents of zinc molybdate may fail to provide satisfactory flame retardance whereas excessive contents may detract from flow during molding and curability.

The zinc molybdate on inorganic carrier is commercially available under the trade name of KEMGARD series, such as KEMGARD 1260, 1261, 1270, 1271 and 911C from Sherwin-Williams Co.

An appropriate amount of the flame retardant (C) in the form of zinc molybdate on inorganic carrier is 1 to 120 parts, more preferably 3 to 100 parts, and especially 5 to 100 parts by weight per 100 parts by weight of the epoxy resin (A) and the phenolic resin curing agent (B) combined. The amount of zinc molybdate alone in the flame retardant (when the molybdenum compound is blended without supporting it on an inorganic carrier, the amount of the molybdenum compound itself) is preferably 0.05 to 35 parts, more preferably 0.1 to 30 parts, and especially 0.2 to 20 parts by weight per 100 parts by weight of the epoxy resin (A) and the phenolic resin curing agent (B) combined. Less amounts may fail to provide satisfactory flame retardance whereas excessive amounts may detract from the flow and curability of the composition.

The composition of the invention contains as component (D) at least one silicon compound selected from among:

(D-i) an organopolysiloxane of the following average compositional formula (1):

$$R^1{}_a SiO_{(4-a)/2} \tag{1}$$

wherein $R^1$ is a substituted or unsubstituted monovalent hydrocarbon group, and "a" is a positive number of 0.8 to 3, with the proviso that two $R^1$ groups, taken together, may form an alkylene group, (D-ii) a cured product of organopolysiloxane, and (D-iii) a block copolymer obtained by reacting an epoxy resin or an alkenyl group-bearing epoxy resin with an organopolysiloxane of the following average compositional formula (2):

$$H_m R^2{}_n SiO_{(4-m-n)/2} \tag{2}$$

wherein $R^2$ is a substituted or unsubstituted monovalent hydrocarbon group, m is a positive number of 0.001 to 0.2, n is a positive number of 1.8 to 2.1, and m+n is 1.801 to 2.3, the number of silicon atoms in a molecule is an integer of 10 to 1,000, and the number of hydrogen atoms directly attached to silicon atoms is 1 to 5, addition reaction taking place between epoxy groups on the epoxy resin or alkenyl groups on the alkenyl group-bearing epoxy resin and silicon-attached hydrogen atoms (i.e., SiH groups) on the organopolysiloxane.

Component (D-i) is an organopolysiloxane of the average compositional formula (1): $R^1{}_a SiO_{(4-a)/2}$ which is typically a non-crosslinkable silicone fluid (oil) or silicone resin (hydrolysis condensate) whereas component (D-ii) is a cured product of organopolysiloxane which is typically a crosslinked silicone rubber or silicone resin. It is known that the addition of a silicone polymer to a plastic material is effective for improving flame retardance because the silicon polymer forms a flame retardant silicon carbide (Si—C) coating upon combustion. According to the invention, component (D-i) and/or (D-ii) is used in combination with the molybdenum compound, especially zinc molybdate, whereby the formation of a silicon carbide (Si—C) coating is promoted to enhance flame retardance.

In formula (1), O represents an oxygen atom forming a siloxane structure (≡Si—O—Si≡). $R^1$ is a substituted or unsubstituted monovalent hydrocarbon group attached to a silicon atom forming the siloxane structure. The unsubstituted monovalent hydrocarbon groups represented by $R^1$ are preferably those having 1 to 12 carbon atoms, and more preferably 1 to 8 carbon atoms, for example, alkyl groups such as methyl, ethyl, propyl, isopropyl, butyl, isobutyl, tert-butyl, pentyl, hexyl, cyclohexyl, and octyl; alkenyl groups such as vinyl, allyl, propenyl, butenyl, and hexenyl; aryl groups such as phenyl, tolyl and naphthyl; and aralkyl groups such as benzyl, phenylethyl, and phenylpropyl. The substituted monovalent hydrocarbon groups include those corresponding to the foregoing unsubstituted monovalent hydrocarbon groups in which some or all hydrogen atoms are replaced by fluorine atoms, cyano, hydroxyl, alkoxy, amino or mercapto groups as well as monovalent hydrocarbon groups containing imino groups, epoxy groups, carboxyl groups, carbinol groups, (methyl)styryl groups, (meth)acrylic groups, polyether groups, higher fatty acid groups, higher fatty acid ester groups, and long-chain alkyl groups of at least 13 carbon atoms. Two $R^1$ groups, taken together, may form an alkylene group of about 1 to 8 carbon atoms, especially about 2 to 6 carbon atoms, such as methylene, ethylene, trimethylene, tetramethylene, methylethylene, or hexamethylene.

The letter "a" is a positive number of 0.8 to 3, preferably 1 to 2.7. The organopolysiloxane may be a linear or cyclic one composed mainly of $R^1_2SiO_{2/2}$ units, or a copolymer of a three-dimensional network (or resinous) structure containing essentially $R^1SiO_{3/2}$ units and/or $SiO_{4/2}$ units and having $R^1_3SiO_{1/2}$ units or $R^1_2SiO_{2/2}$ units optionally combined therewith.

The organopolysiloxane (D-i) represented by formula (1) preferably has a number average degree of polymerization of 2.5 to 1,000, and more preferably 3 to 200. It is noted that the degree of polymerization corresponds to the number of silicon atoms in the molecule. An organopolysiloxane with a number average degree of polymerization of less than 2.5 may give rise to problems of volatility and compatibility because of a low molecular weight whereas an organopolysiloxane with a number average degree of polymerization of more than 1,000 may become high viscous and less dispersible.

Among component (D-i), polydimethylsiloxane and polymethylphenylsiloxane are typical of the non-functional linear organopolysiloxane which does not contain a functional group-substituted monovalent hydrocarbon group in the molecule. Modified organopolysiloxanes include amino-modified polyorganosiloxanes, epoxy-modified polyorganosiloxanes, carboxyl-modified polyorganosiloxanes, carbinol-modified polyorganosiloxanes, methacryl-modified polyorganosiloxanes, mercapto-modified polyorganosiloxanes, phenol-modified polyorganosiloxanes, polyorganosiloxanes modified to be reactive at one end, polyorganosiloxanes modified with different functional groups, polyether-modified polyorganosiloxanes, methylstyryl-modified polyorganosiloxanes, long-chain (usually about $C_{13-30}$) alkyl-modified polyorganosiloxanes, higher fatty acid ester-modified polyorganosiloxanes, higher fatty acid-containing modified polyorganosiloxanes, and fluorine-modified polyorganosiloxanes such as trifluoropropyl-methylpolysiloxane. These organopolysiloxanes may be linear, branched or cyclic.

Polyorganosiloxane resins are generally divided into polymethylsiloxane resins and poly(methyl)phenylsiloxane resins. Those having a carbon-to-carbon double bond in the structure are known to be highly flame retardant. The polymethylsiloxane resins are generally copolymers containing $SiO_2$ and/or $CH_3SiO_{3/2}$ essentially and having $(CH_3)_2SiO$, $(CH_2=CH)(CH_3)_2SiO_{1/2}$ and $(CH_3)_3SiO_{1/2}$ structural units combined therewith. The poly(methyl)phenylsiloxane resins are generally copolymers containing $C_6H_5SiO_{3/2}$ and/or $SiO_2$ essentially and having $(C_6H_5)(CH_3)_2SiO_{1/2}$, $(CH_3)_2SiO$, $CH_3SiO_{3/2}$, $(CH_3)_3SiO_{1/2}$, $(CH_2=CH)(CH_3)_2SiO_{1/2}$, $C_6H_5(CH_3)SiO$, and $(C_6H_5)_2SiO$ structural units combined therewith, and are more heat resistant than the polymethylsiloxane resins.

The cured product of organopolysiloxane used as component (D-ii) should have a crosslinked structure and is selected from the silicone rubbers and silicone resins shown below. Included are organopolysiloxane rubbers cured by addition reaction in the presence of a platinum catalyst, organopolysiloxane rubbers cured by condensation reaction (the condensation reaction including reactions of eliminating water, hydrogen, alcohol, oxime, amine, amide, carboxylic acid, and ketone), organopolysiloxane rubbers heat cured with organic peroxides, organopolysiloxane rubbers cured by irradiating ultraviolet radiation, and organopolysiloxane resins cured by any of the foregoing reactions. Organopolysiloxane cured products having a functional group such as a silanol, hydroxy, carboxy, vinyl, amino, mercapto, epoxy, methoxy, or ethoxy group in the structure may also be used. These organopolysiloxane cured products are ground by means of a suitable pulverizer and the resulting powder is used. Since the advanced mold for molding electronic parts such as ICs has a reduced gate size matching with the desired size reduction of packages, particles of the organopolysiloxane cured product should preferably have a mean particle size of up to 50 μm, and especially up to 20 μm from the molding standpoint. The lower limit is usually 0.01 μm, and preferably 0.1 μm.

Of the above-described organopolysiloxanes (D-i), polyether-modified polyorganosiloxane compounds having polyether groups with a high affinity to the matrix resin are preferred from the standpoints of marking on the package surface and adhesion. The polyether-modified polyorganosiloxane compounds are exemplified by the following compounds.

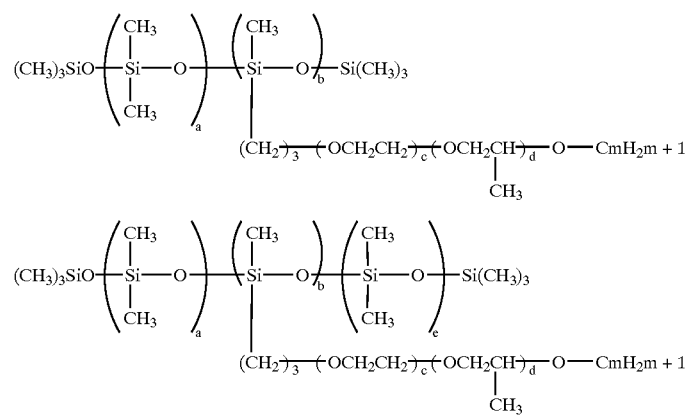

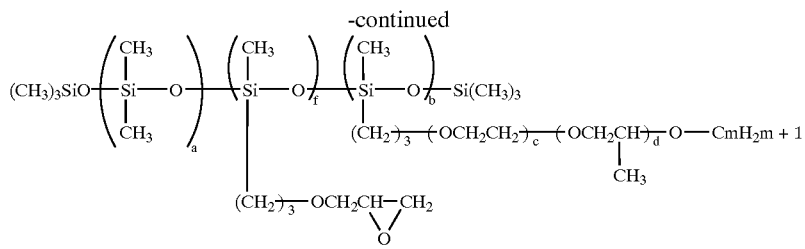
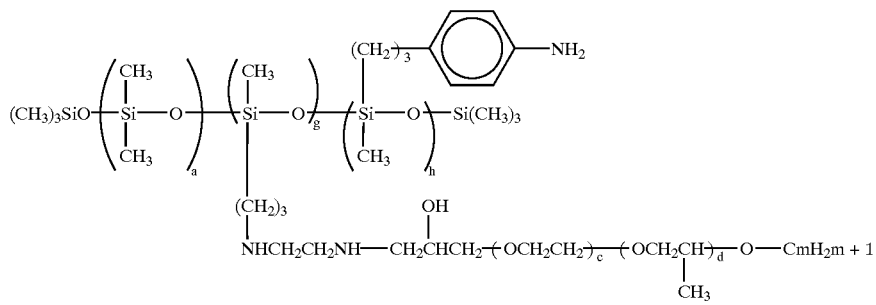
In the formulae, letters a to h and m have the following meaning.
- a: integer of 5 to 200
- b: integer of 1 to 5
- c: integer of 0 to 30
- d: integer of 0 to 30
- c+d: integer of 10 to 60
- e: integer of 1 to 50
- f: integer of 1 to 5
- g: integer of 1 to 5
- h: integer of 1 to 5
- m: integer of 1 to 6
Illustrative examples of the polyether-modified organopolysiloxane are given below.
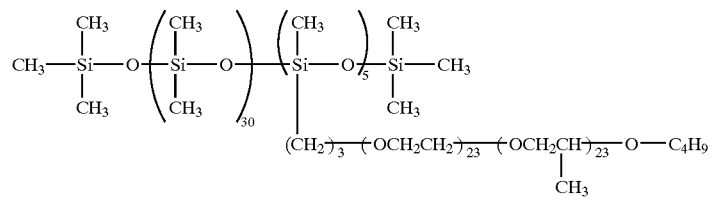
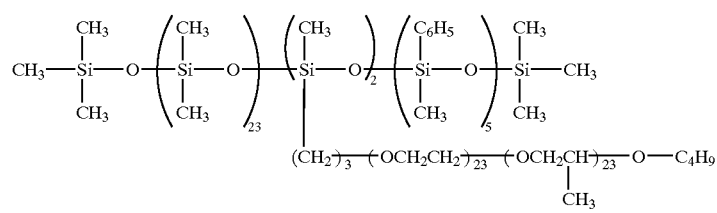
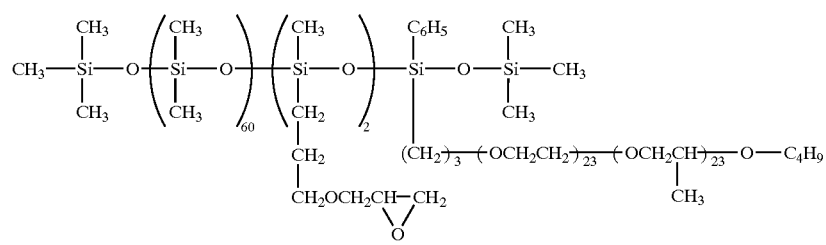

-continued

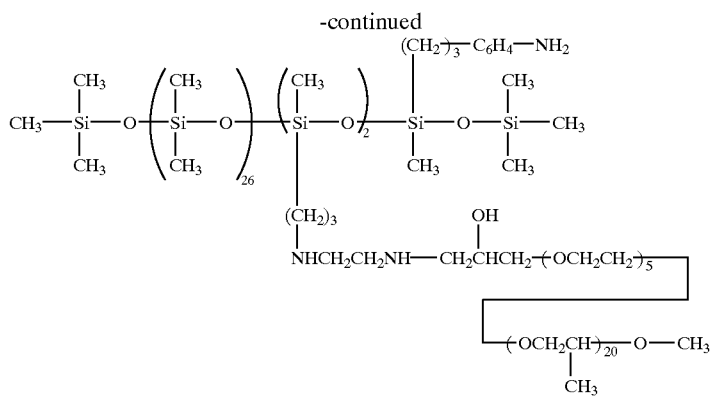

It is acceptable to use the polyether-modified organopolysiloxane as a compatibilizing agent in combination with another organopolysiloxane compound such as an amino- or epoxy-modified organopolysiloxane having an amino functional or epoxy functional group attached to a silicon atom at an end or intermediate of the molecular chain as exemplified below or an organopolysiloxane cured product as mentioned above.

In the formulae, letters i to n have the following meaning.
i: integer of 5 to 200
j: integer of 1 to 50
k: integer of 50 to 2000
l: integer of 1 to 10
m: integer of 1 to 10
n: integer of 1 to 10

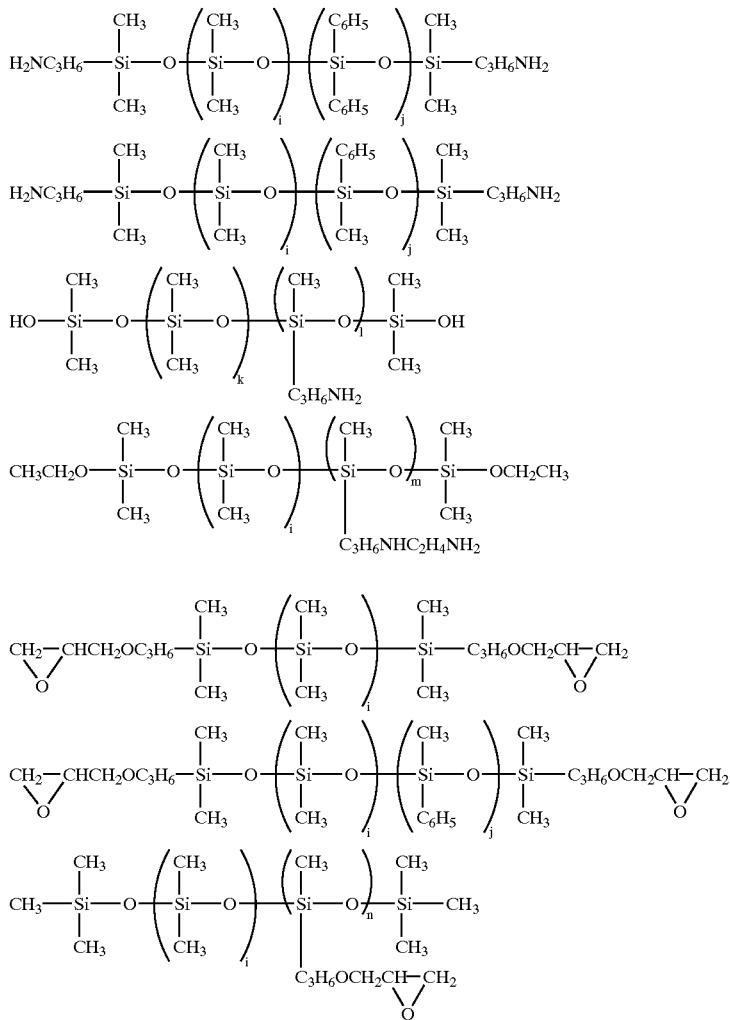

Illustrative examples of the amino- and epoxy-modified organopolysiloxanes are given below.

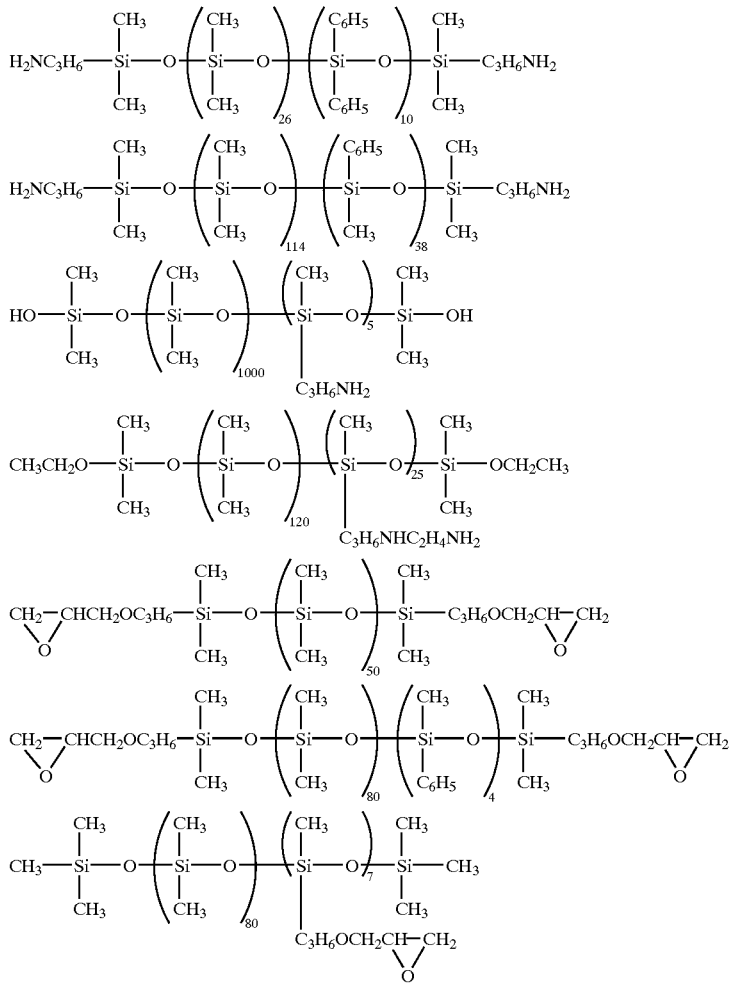

An appropriate amount of component (D-i) or (D-ii) blended is 0.1 to 8 parts, and especially 0.2 to 4 parts by weight per 100 parts by weight of the epoxy resin (A) and phenolic resin curing agent (B) combined. Less than 0.1 part may fail to achieve a satisfactory flame retardance whereas more than 8 parts may lead to the disadvantages of an increased viscosity and a reduced mechanical strength.

Component (D-iii) is a block copolymer obtained by reacting an epoxy resin or an alkenyl group-bearing epoxy resin with an organopolysiloxane of the following average compositional formula (2):

$$H_m R^2{}_n SiO_{(4-m-n)/2} \qquad (2)$$

wherein $R^2$ is a substituted or unsubstituted monovalent hydrocarbon group, m is a positive number of 0.001 to 0.2, n is a positive number of 1.8 to 2.1, and m+n is 1.801 to 2.3, the number of silicon atoms in a molecule is an integer of 10 to 1,000, and the number of hydrogen atoms directly attached to silicon atoms is 1 to 5, preferably 1 to 3, and most preferably equal to 2, addition reaction taking place between epoxy groups on the epoxy resin or alkenyl groups on the alkenyl group-bearing epoxy resin and silicon-attached hydrogen atoms (i.e., SiH groups) on the organopolysiloxane. As previously described, it is known that the addition of a silicone polymer to a plastic material is effective for improving flame retardance because the silicon polymer forms a flame retardant silicon carbide (Si—C) coating upon combustion. According to the invention, component (D-iii) is used in combination with the molybdenum compound, especially zinc molybdate, whereby the formation of a silicon carbide (Si—C) coating is promoted to enhance flame retardance. In particular, since the block copolymer (D-iii) has an epoxy resin structure as well as an organopolysiloxane structure in the molecule, it can be microscopically dispersed in a resin matrix of the epoxy resin and the phenolic resin curing agent to form an island-in-sea structure, which contributes to a further improvement in flame retardance.

The epoxy resin used as one component of the copolymer may be selected from the same epoxy resins exemplified for component (A), especially difunctional epoxy resins having two epoxy groups per molecule, for example, difunctional epoxy resins represented by the following formula (6). The alkenyl group-bearing epoxy resin used herein may be selected from a variety of epoxy resins which have at least one, and preferably at least two epoxy groups such as glycidyloxy groups attached to an aromatic ring and at least one, and preferably at least two alkenyl groups, for example, alkenyl group-bearing epoxy resins of the structure represented by the following formulae (3) to (5).

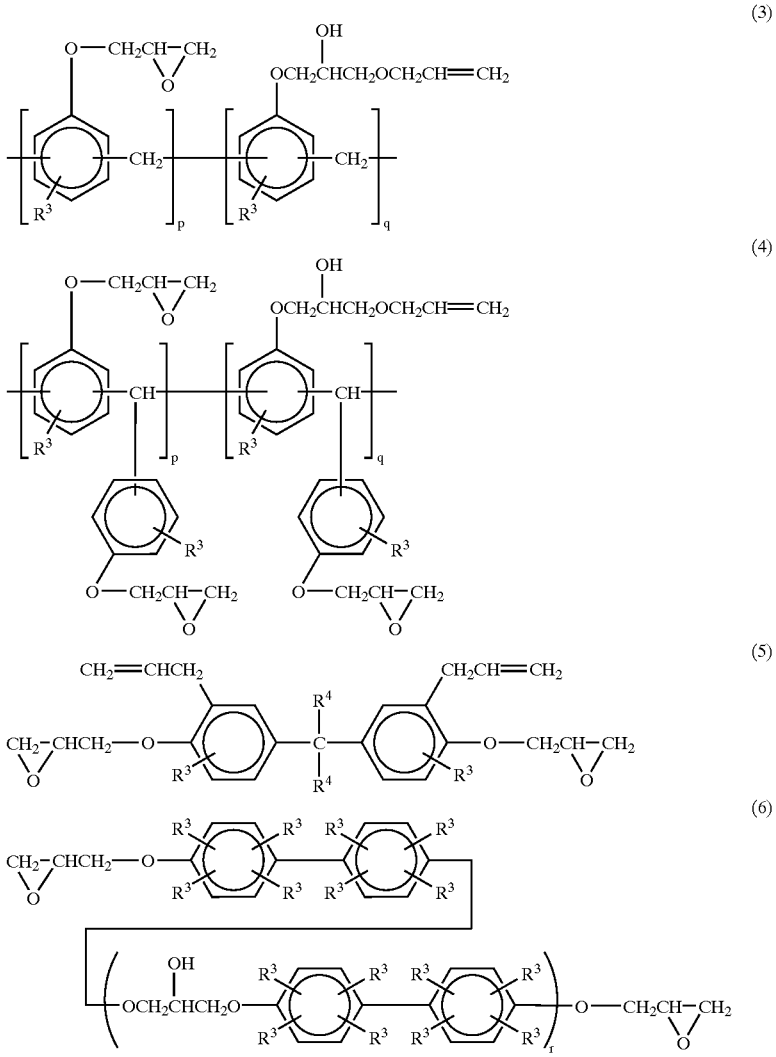

Herein, $R^3$ is hydrogen, methyl or bromine, $R^4$ is hydrogen, methyl or trifluoromethyl, p and q are natural numbers, and preferably p+q is from 2 to 50, more preferably from 2 to 20, and r is an integer of 0 to 5.

In the average compositional formula (2) representing the organohydrogenpolysiloxane, the substituted or unsubstituted monovalent hydrocarbon groups attached to silicon atoms represented by $R^2$ are preferably those of 1 to 10 carbon atoms, and especially those free of aliphatic unsaturation, for example, alkyl groups such as methyl, ethyl, n-propyl, isopropyl, n-butyl, isobutyl, tert-butyl, pentyl, neopentyl, hexyl, cyclohexyl, octyl, and decyl; alkenyl groups such as vinyl, allyl, propenyl, and butenyl; aryl groups such as phenyl and tolyl; and aralkyl groups such as benzyl and phenylethyl; substituted ones of the foregoing hydrocarbon groups in which some or all of the hydrogen atoms are replaced by fluorine atoms or alkoxy groups, for example, fluorine-substituted monovalent hydrocarbon groups such as fluorine-substituted alkyl groups, e.g., 3,3,3-trifluoropropyl and alkoxy-substituted monovalent hydrocarbon groups such as alkoxy-substituted alkyl groups, e.g., methoxymethyl, methoxyethyl, ethoxymethyl and ethoxyethyl. Of these, the unsubstituted monovalent hydrocarbon group not having an aliphatic unsaturated bond, such as an alkyl group, aryl group and aralkyl group is preferred, and especially methyl and phenyl are most preferred.

In formula (2), m and n are as defined above, preferably $0.005 \leq m \leq 0.1$, $1.9 \leq n \leq 2.1$, and $1.905 \leq m+n \leq 2.2$, and more preferably $0.01 \leq m \leq 0.1$, $1.95 \leq n \leq 2.0$, and $1.96 \leq m+n \leq 2.1$. The number of silicon atoms in a molecule is an integer of about 10 to 1,000, preferably about 20 to 400 and more preferably about 40 to 200.

Exemplary organohydrogenpolysiloxanes include both end trimethylsiloxy group-blocked methylhydrogenpolysiloxane, both end trimethylsiloxy group-blocked dimethylsiloxane-methylhydrogensiloxane copolymers, both end dimethylhydrogensiloxy group-blocked dimethylpolysiloxane, both end dimethylhydrogensiloxy group-blocked dimethylsiloxane-methylhydrogensiloxane copolymers, both end dimethylhydrogensiloxy group-blocked dimethylsiloxane-diphenylsiloxane copolymers, and both end dimethylhydrogensiloxy group-blocked dimethylsiloxane-methylphenylsiloxane copolymers. These are basically of a linear structure although they may partially contain a branched siloxane structure.

The organopolysiloxane desirably has a molecular weight of 700 to 75,000 though not limited thereto. When a copolymer of an organopolysiloxane with a molecular weight of 700 to 75,000 is blended in an epoxy resin composition, the copolymer is not compatible with the matrix and forms a microscopic island-in-sea structure. With a molecular weight of less than 700, the copolymer may become compatible with the matrix with the island-in-sea structure lost. With a molecular weight of more than 75,000, the copolymer may form a large island-in-sea structure. In either case, cured products may lose flame retardance and low stress properties.

The copolymer of the alkenyl group-bearing epoxy resin with the organohydrogenpolysiloxane can be prepared by effecting addition reaction known as hydrosilylation reaction between alkenyl groups on the epoxy resin and silicon atom-attached hydrogen atoms (i.e., SiH groups) on the organohydrogenpolysiloxane. The copolymer of the alkenyl group-free epoxy resin (e.g., difunctional epoxy resin) with the organohydrogenpolysiloxane can be prepared by effecting direct addition reaction between epoxy groups on the epoxy resin and SiH groups on the organohydrogenpolysiloxane.

As the block copolymer, use may be made of the well-known copolymers described in U.S. Pat. No. 4,902,732 (JP-B 61-48544), U.S. Pat. No. 4,877,822, and U.S. Pat. No. 5,053,445 (JP-B 63-60069). Illustrative examples of these copolymers are given below.

Herein, Me is methyl, R is $C_{1-10}$ alkyl or phenyl, and k is an integer of 10 to 500.

An appropriate amount of component (D-iii) blended is 1 to 10 parts, and especially 2 to 8 parts by weight, calculated as organopolysiloxane, per 100 parts by weight of the epoxy resin (A) and phenolic resin curing agent (B) combined. Less than 1 part may fail to achieve a satisfactory flame retardance whereas more than 10 parts may invite an increased viscosity and detract from the reliability, especially solder crack resistance of the semiconductor device encapsulated therewith.

The inorganic filler (E) included in the epoxy resin compositions of the invention may be any suitable inorganic filler commonly used in epoxy resin compositions. Illustrative examples include silicas such as fused silica and crystalline silica, alumina, silicon nitride, aluminum nitride, boron nitride, titanium oxide, and glass fibers. No particular limit is imposed on the mean particle diameter and shape of these inorganic fillers, although the use of spherical fused silica having a mean particle diameter of 1 to 40 μm, and especially 2 to 25 μm is preferred because it endows the epoxy resin composition with good molding and flow characteristics.

The inventive epoxy resin compositions have inorganic filler loadings of preferably 300 to 1,000 parts by weight, and more preferably 500 to 900 parts by weight per 100 parts

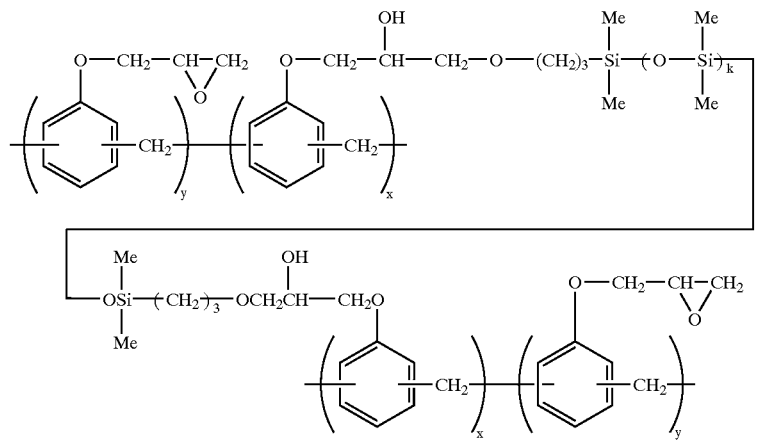

Herein, Me is methyl, x and y are positive integers satisfying $10 \leq y/x \leq 30$, and k is an integer of 10 to 500.

by weight of the mixture of the epoxy resin (A), the phenolic resin curing agent (B) and the optional block copolymer

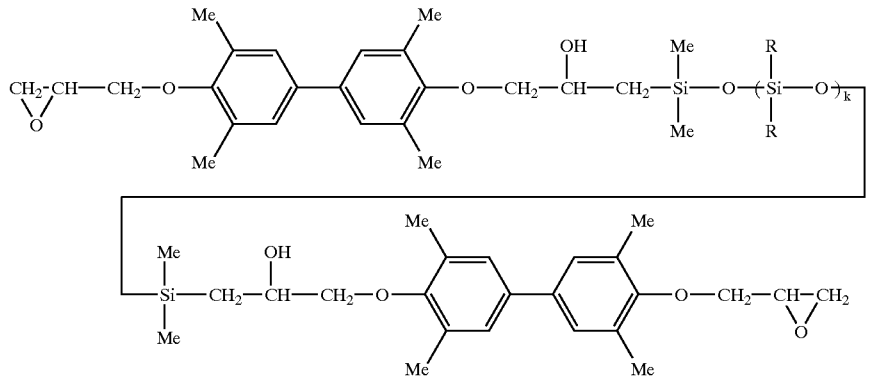

(D-iii). At less than 300 parts by weight, the epoxy resin composition would have a large coefficient of expansion, resulting in greater stress on the semiconductor device and a decline in the device characteristics. Moreover, the proportion of resin relative to the overall composition becomes larger, sometimes failing to attain the fire retardance that is the object of this invention. On the other hand, more than 1,000 parts by weight of the inorganic filler would result in an excessive rise in viscosity during molding and thus impede molding. The content of inorganic filler within the epoxy resin composition (excluding the flame retardant (C)) is preferably 70 to 92% by weight, and especially 80 to 90% by weight.

The inorganic filler used herein is preferably surface treated beforehand with a coupling agent such as a silane coupling agent or a titanate coupling agent in order to increase the bonding strength between the resin and the inorganic filler. Preferred examples of such coupling agents include epoxy silanes such as γ-glycidoxypropyltrimethoxysilane, γ-glycidoxypropylmethyldiethoxysilane, and β-(3,4-epoxycyclohexyl)ethyltrimethoxysilane; aminosilanes such as N-β-(aminoethyl)-γ-aminopropyltrimethoxysilane, γ-aminopropyltriethoxysilane, and N-phenyl-γ-aminopropyltrimethoxysilane; and mercaptosilanes such as γ-mercaptopropyltrimethoxysilane and γ-mercaptopropylmethyldimethoxysilane. No particular limitation is imposed on the amount of coupling agent used for surface treatment or the method of surface treatment.

In the practice of this invention, use is preferably made of a curing accelerator to promote the curing reaction between the epoxy resin and the curing agent. The curing accelerator may be any suitable substance that promotes the curing reaction. Illustrative, non-limiting examples of curing accelerators that may be used include organic phosphorus compounds such as triphenylphosphine, tributylphosphine, tri(p-methylphenyl)phosphine, tri(nonylphenyl)-phosphine, triphenylphosphine triphenylborane, and tetraphenylphosphine tetraphenylborate; tertiary amine compounds such as triethylamine, benzyldimethylamine, α-methylbenzyldimethylamine, and 1,8-diazabicyclo [5.4.0]-undecene-7; and imidazole compounds such as 2-methylimidazole, 4-methylimidazole, 2-phenylimidazole, 2-phenyl-4-methylimidazole, 2-phenyl-4-hydroxymethylimidazole, 2-phenyl-4-methyl-5-hydroxymethylimidazole, and 2-phenyl-4,5-dihydroxymethylimidazole.

The semiconductor encapsulating epoxy resin compositions of the invention may also include various additives, if necessary. Illustrative examples include stress-lowering additives such as thermoplastic resins, thermoplastic elastomers, and synthetic organic rubbers; waxes such as carnauba wax, higher fatty acids, and synthetic waxes; colorants such as carbon black; and halogen trapping agents. Also, any of well-known diluents such as n-butyl glycidyl ether, phenyl glycidyl ether, styrene oxide, t-butyl phenyl glycidyl ether, dicyclopentadiene epoxide, phenol, cresol, and t-butylphenyl may be added for the purpose of lowering the viscosity.

The inventive epoxy resin compositions may be prepared by compounding the epoxy resin, curing agent, inorganic filler, and other components in predetermined proportions, thoroughly mixing these components together in a mixer or other appropriate apparatus, then melting and working the resulting mixture using a hot roll mill, kneader, extruder or the like. The worked mixture is then cooled and solidified, and subsequently ground to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 180° C. for a period of about 30 to 180 seconds, followed by postcuring at about 150 to 180° C. for about 2 to 16 hours.

The semiconductor encapsulating epoxy resin compositions of the invention cure into products which have an excellent fire retardance, moisture resistance and solder cracking resistance. Owing to the absence of halogenated epoxy resins and antimony compounds (e.g., antimony trioxide), the epoxy resin compositions have no adverse impact on human health or the environment.

EXAMPLE

Examples of the invention and comparative examples are given below by way of illustration, and are not intended to limit the invention. All parts are by weight. Me stands for methyl.

The raw materials used in Examples are shown below.
Epoxy resins:
  (a) o-cresol novolac epoxy resin: EOCN1020-55 by Nippon Kayaku K.K. (epoxy equivalent 200)
  (b) biphenyl epoxy resin: YX4000HK by Yuka Shell K.K. (epoxy equivalent 190)
Curing agents:
  (c) phenolic novolac resin: DL-92 by Meiwa Kasei K.K. (phenolic equivalent 110)
  (d) phenolic aralkyl resin: MEH-7800SS by Meiwa Kasei K.K. (phenolic equivalent 175)
Zinc molybdate on inorganic carrier (zinc molybdate content 18 wt %):
  KEMGARD 1261 (carrier: spherical silica with a mean particle size 0.5 μm and a specific surface area 5.5 m²/g) by Sherwin-Williams Co.
  KEMGARD 911C (carrier: talc with a mean particle size 2.0 μm and a specific surface area 2.0 m²/g) by Sherwin-Williams Co.
Inorganic filler:
  Spherical fused silica (mean particle size 20 pn) by Tatsumori K.K.
Polyorganosiloxane A:
  KF96 (dimethylsilicone fluid (oil), viscosity 1,000 cs at 25° C.) by Shin-Etsu Chemical Co., Ltd.
Polyorganosiloxane B (polyether-modified silicone oil):

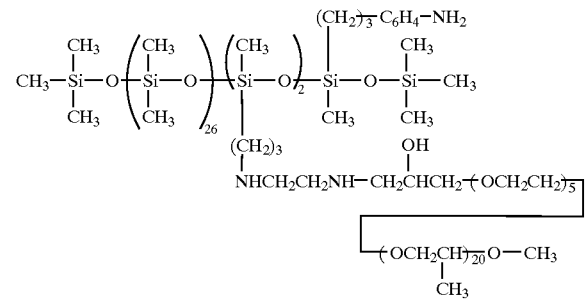

Polyorganosiloxane C:
  KF54 (methylphenylsilicone fluid (oil), viscosity 400 as at 25° C.) by Shin-Etsu Chemical Co., Ltd.

Polyorganosiloxane D:

A liquid silicone resin of three-dimensional network structure was prepared by the following procedure.

A 1-liter flask equipped with a stirrer, condenser and thermometer was charged with 211 g (1 mol) of phenyltrichlorosilane and 143 g of toluene, and heated to an internal temperature of 40° C. in an oil bath. A dropping funnel was charged with 64 g (2 mol) of methanol, which was added dropwise to the flask, with stirring, over one hour. Alkoxylation reaction proceeded while hydrogen chloride gas given off during the reaction was removed out of the system. At the end of dropwise addition, agitation was continued for one hour at the internal temperature of 40° C. for ripening. Next, the dropping funnel was charged with 12 g (0.7 mol) of water, which was added dropwise to the flask, with stirring, over one hour. Hydrolytic condensation reaction proceeded while hydrogen chloride gas given off during the reaction was removed out of the system. At the end of dropwise addition, agitation was continued for one hour at the internal temperature of 40° C. for ripening. The toluene, the excess of methanol, unreacted water, and hydrogen chloride were removed by vacuum distillation, yielding 151 g of a liquid methoxy group-bearing polyorganosiloxane.

The resulting polyorganosiloxane is represented by the compositional formula: $R^3_m Si(OR^5)_p(OH)_q O_{(4-m-p-q)/2}$ wherein m=1.0, the organic substituent $R^3$ attached to a Si atom through a Si—C bond consisted of 100 mol % phenyl, p=1.5, $R^5$ is methyl, and q=0.2, containing 100 mol % of trifunctional siloxane units. It looked a colorless clear liquid and had a number average degree of polymerization of 3 and a number average molecular weight of 500.

Polyorganosiloxane-epoxy resin copolymer (organopolysiloxane content 16 wt %):

(1) Spiral Flow:
Measured by molding at 175° C. and 70 kgf/cm² for a molding time of 90 seconds using a mold in accordance with EMMI standards.

(2) Hardness When Molded:
Using the method described in JIS-K6911, a rod measuring 10×4×100 mm was molded at 175° C. and 70 kgf/cm² for a time of 90 seconds. The hardness when hot was measured with a Barcol Impressor.

(3) Moldability
A QFP package of 14×20×3.5 mm was molded. Using an ultrasonic flaw detector, internal voids were detected.

(4) Flame Retardance:
A 1/16 inch thick sheet was molded and the flame retardance of the sheet was rated in accordance with UL-94 test specifications.

(5) Moisture Resistance:
A silicon chip measuring 1×1 mm on which aluminum wiring had been formed was adhesively bonded to a 14-pin dual in-line package (DIP) frame (Alloy 42), and the aluminum electrodes on the chip surface were wire bonded to the lead frame using 30 μm gold wire. The epoxy resin composition was then molded over the chip at 175° C. and 70 kgf/cm² for a time of 120 seconds, and post-cured at 180° C. for 4 hours. Twenty packages thus obtained were left to stand for 500 hours at 140° C. and 85% relative humidity while being subjected to a bias voltage of 5V DC. The number of packages in which aluminum corrosion arose was counted.

(6) Solder Cracking Resistance
A flat package of 14×20×2.7 mm was molded using an epoxy resin composition. It was postcured at 180° C. for 4 hours, allowed to stand in a thermostat chamber at 85° C. and RH 85% for 168 hours, and immersed in a solder bath

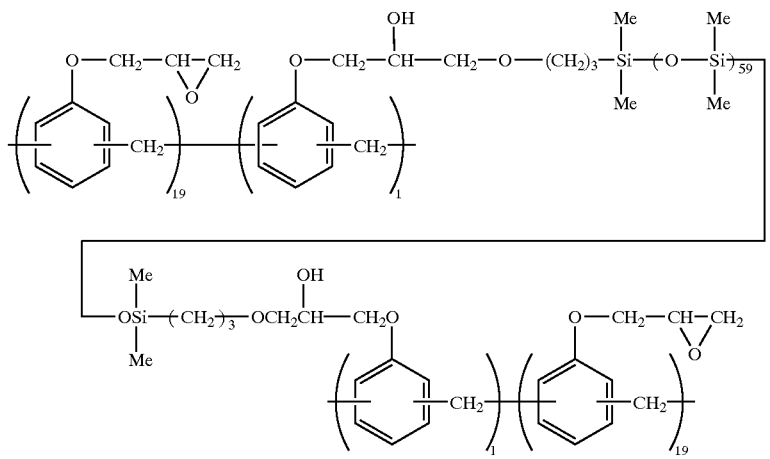

Curing accelerator:
   triphenyl phosphine by Hokko Chemical K.K.
Parting agent:
   Carnauba wax by Nikko Fine Products K.K.
Silane coupling agent:
   KBM403 (γ-glycidoxypropyltrimethoxysilane) by Shin-Etsu Chemical Co., Ltd.

Properties of epoxy resin compositions were measured by the following methods.

at a temperature of 220° C. for 30 seconds. The outside of the package were observed to inspect cracks.

Examples 1–8 and Comparative Examples 1–4

Epoxy resin compositions for semiconductor encapsulation were prepared by uniformly melt mixing the components shown in Tables 1 and 2 in a hot twin-roll mill, followed by cooling and grinding. The measured properties of the compositions are shown in Tables 3 and 4.

TABLE 1

| Ingredients (pbw) | Ex.1 | Ex.2 | Ex.3 | Ex.4 | Ex.5 | Ex.6 | Ex.7 | Ex.8 |
|---|---|---|---|---|---|---|---|---|
| Epoxy resin (a) | 64.52 | 64.52 | 64.52 | 64.52 | 64.52 | 64.52 | — | — |
| Epoxy resin (b) | — | — | — | — | — | — | 52.71 | 52.71 |
| Curing agent (c) | 35.48 | 35.48 | 35.48 | 35.48 | 35.48 | 35.48 | — | — |
| Curing agent (d) | — | — | — | — | — | — | 47.29 | 47.29 |
| Polyorganosiloxane A | 4 | — | — | — | 8 | — | — | 8 |
| Polyorganosiloxane B | — | 4 | — | — | — | 0.1 | 0.1 | — |
| Polyorganosiloxane C | — | — | 4 | — | — | — | — | — |
| Polyorganosiloxane D | — | — | — | 4 | — | — | — | — |
| Inorganic filler | 500 | 500 | 500 | 500 | 500 | 850 | 850 | 850 |
| Curing accelerator | 1.2 | 1.2 | 1.2 | 1.2 | 1.2 | 1.2 | 1.2 | 1.2 |
| KEMGARD 1261 | 100 | 100 | 100 | 100 | 60 | 100 | 10 | 5 |
| Antimony trioxide | — | — | — | — | — | — | — | — |
| Brominated novolac type epoxy resin | — | — | — | — | — | — | — | — |
| Parting agent | 3 | 3 | 3 | 3 | 3 | 3 | 3 | 3 |
| Carbon black | 2 | 2 | 2 | 2 | 2 | 2 | 2 | 2 |
| Silane coupling agent | 1 | 1 | 1 | 1 | 1 | 1 | 1 | 1 |

TABLE 2

| Ingredients (pbw) | Comp. Ex. 1 | Comp. Ex. 2 | Comp. Ex. 3 | Comp. Ex. 4 |
|---|---|---|---|---|
| Epoxy resin (a) | 64.52 | 58.32 | — | — |
| Epoxy resin (b) | — | — | 52.71 | 52.71 |
| Curing agent (c) | 35.48 | 35.48 | — | — |
| Curing agent (d) | — | — | 47.29 | 47.29 |
| Polyorganosiloxane A | — | — | — | — |
| Polyorganosiloxane B | — | — | — | 10 |
| Polyorganosiloxane C | — | — | — | — |
| Polyorganosiloxane D | — | — | — | — |
| Inorganic filler | 500 | 500 | 500 | 500 |
| Curing accelerator | 1.2 | 1.2 | 1.2 | 1.2 |
| KEMGARD 1261 | 100 | — | — | — |
| Antimony trioxide | — | 4 | — | — |
| Brominated novolac type epoxy resin | — | 6.2 | — | — |
| Parting agent | 3 | 3 | 3 | 3 |
| Carbon black | 2 | 2 | 2 | 2 |
| Silane coupling agent | 1 | 1 | 1 | 1 |

TABLE 3

| | Ex.1 | Ex.2 | Ex.3 | Ex.4 | Ex.5 | Ex.6 | Ex.7 | Ex.8 |
|---|---|---|---|---|---|---|---|---|
| Spiral flow (cm) | 95 | 85 | 83 | 80 | 65 | 90 | 115 | 80 |
| Hardness when molded | 80 | 75 | 78 | 81 | 75 | 80 | 73 | 70 |
| Moldability | OK | OK | OK | OK | OK | OK | OK | OK |
| Flame retardance | V-0 | V-0 | V-0 | V-0 | V-0 | V-0 | V-0 | V-0 |
| Moisture resistance | 0/20 | 0/20 | 0/20 | 0/20 | 0/20 | 0/20 | 0/20 | 0/20 |
| Solder cracking resistance | 0/5 | 0/5 | 0/5 | 0/5 | 0/5 | 0/5 | 0/5 | 0/5 |

TABLE 4

|  | Comp. Ex. 1 | Comp. Ex. 2 | Comp. Ex. 3 | Comp. Ex. 4 |
|---|---|---|---|---|
| Spiral flow (cm) | 98 | 90 | 125 | 70 |
| Hardness when molded | 80 | 80 | 78 | 65 |
| Moldability | OK | OK | NG | NG |
| Flame retardance | burned | V-0 | V-1 | V-0 |
| Moisture resistance | 0/20 | 7/20 | 0/20 | 0/20 |
| Solder cracking resistance | 4/5 | 3/5 | 0/5 | 0/5 |

From Tables 3 and 4, it is evident that the semiconductor encapsulating epoxy resin compositions of the invention are able to cure into products which have excellent flame retardance and solder crack resistance. The compositions are effectively moldable and moisture resistant. The compositions have no ill effects on human health and the environment because they contain no halogenated epoxy resins or antimony trioxide.

Examples 9–16 and Comparative Examples 5–9

Epoxy resin compositions for semiconductor encapsulation were prepared by uniformly melt mixing the components shown in Tables 5 and 6 in a hot twin-roll mill, followed by cooling and grinding. The measured properties of the compositions are shown in Tables 7 and 8.

TABLE 5

| Ingredients (pbw) | Ex.9 | Ex.10 | Ex.11 | Ex.12 | Ex.13 | Ex.14 | Ex.15 | Ex.16 |
|---|---|---|---|---|---|---|---|---|
| Epoxy resin (a) | 47.55 | 47.55 | 7.06 | 7.06 | — | — | — | — |
| Epoxy resin (b) | — | — | — | — | 46.41 | 6.89 | 57.55 | 17.03 |
| Curing agent (c) | — | — | — | — | — | — | 36.20 | 32.97 |
| Curing agent (d) | 46.20 | 46.20 | 42.94 | 42.94 | 47.34 | 43.11 | — | — |
| Epoxy-modified silicone resin | 6.25 | 6.25 | 50.0 | 50.0 | 6.25 | 50.0 | 6.25 | 50.0 |
| (Amount of siloxane added) | 1 | 1 | 8 | 8 | 1 | 8 | 1 | 8 |
| Inorganic filler | 500 | 500 | 500 | 500 | 850 | 850 | 760 | 760 |
| Curing accelerator | 1.2 | 1.2 | 1.2 | 1.2 | 1.2 | 1.2 | 1.2 | 1.2 |
| KEMGARD 1261 | 80 | 100 | 80 | 100 | — | — | 100 | 100 |
| KEMGARD 911C | — | — | — | — | 10 | 10 | — | — |
| Antimony trioxide | — | — | — | — | — | — | — | — |
| Brominated novolac type epoxy resin | — | — | — | — | — | — | — | — |
| Parting agent | 3 | 3 | 3 | 3 | 3 | 3 | 3 | 3 |
| Carbon black | 2 | 2 | 2 | 2 | 2 | 2 | 2 | 2 |
| Silane coupling agent | 1 | 1 | 1 | 1 | 1 | 1 | 1 | 1 |

TABLE 6

| Ingredients (pbw) | Comp. Ex. 5 | Comp. Ex. 6 | Comp. Ex. 7 | Comp. Ex. 8 | Comp. Ex. 9 |
|---|---|---|---|---|---|
| Epoxy resin (a) | 53.33 | 53.33 | — | — | 46.5 |
| Epoxy resin (b) | — | — | — | — | — |
| Curing agent (c) | — | — | — | — | 34.8 |
| Curing agent (d) | 46.67 | 46.67 | 37.5 | 37.5 | — |
| Epoxy-modified silicone resin | 0 | 0 | 62.5 | 62.5 | 12.5 |
| (Amount of siloxane added) | 0 | 0 | 10 | 10 | 2 |
| Inorganic filler | 500 | 500 | 500 | 500 | 500 |
| Curing accelerator | 1.2 | 1.2 | 1.2 | 1.2 | 1.2 |
| KEMGARD 1261 | — | 80 | — | 80 | — |
| KEMGARD 911C | — | — | — | — | — |
| Antimony trioxide | — | — | — | — | 4 |
| Brominated novolac type epoxy resin | — | — | — | — | 6.2 |
| Parting agent | 3 | 3 | 3 | 3 | 3 |
| Carbon black | 2 | 2 | 2 | 2 | 2 |
| Silane coupling agent | 1 | 1 | 1 | 1 | 1 |

TABLE 7

|  | Ex.9 | Ex.10 | Ex.11 | Ex.12 | Ex.13 | Ex.14 | Ex.15 | Ex.16 |
|---|---|---|---|---|---|---|---|---|
| Spiral flow (cm) | 95 | 85 | 83 | 77 | 120 | 115 | 95 | 80 |
| Hardness when molded | 80 | 75 | 78 | 75 | 70 | 73 | 80 | 81 |
| Moldability | OK | OK | OK | OK | OK | OK | OK | OK |
| Flame retardance | V-0 | V-0 | V-0 | V-0 | V-0 | V-0 | V-0 | V-0 |
| Solder cracking resistance | 0/5 | 0/5 | 0/5 | 0/5 | 0/5 | 0/5 | 0/5 | 0/5 |

TABLE 8

|  | Comp. Ex. 5 | Comp. Ex. 6 | Comp. Ex. 7 | Comp. Ex. 8 | Comp. Ex. 9 |
|---|---|---|---|---|---|
| Spiral flow (cm) | 125 | 100 | 55 | 40 | 110 |
| Hardness when molded | 80 | 78 | 82 | 78 | 80 |
| Moldability | OK | OK | NG | NG | OK |
| Flame retardance | burned | V-1 | V-1 | V-0 | V-0 |
| Solder cracking resistance | 5/5 | 5/5 | 1/5 | 2/5 | 0/5 |

From Tables 7 and 8, it is evident that the semiconductor encapsulating epoxy resin compositions of the invention are able to cure into products which have excellent flame retardance. The compositions are effectively moldable and moisture resistant. The compositions have no ill effects on human health and the environment because they contain no halogenated epoxy resins or antimony trioxide.

Japanese Patent Application Nos. 11–118155 and 11-118408 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating, flame retardant epoxy resin composition comprising:

(A) an epoxy resin,
(B) a phenolic resin curing agent,
(C) zinc molybdate supported on an inorganic carrier,
(D) at least one organopolysiloxane (D-i) of the following average compositional formula (1):

$$R^1_a SiO_{(4-a)/2} \qquad (1)$$

wherein $R^1$ is a substituted or unsubstituted monovalent hydrocarbon group, and "a" is a positive number of 0.8 to 3, with the proviso that two $R^1$ groups, taken together, may form an alkylene group, said organopolysiloxane being selected from the group consisting of polyether-modified polyorganosiloxane compounds and copolymers of three-dimensional network structure containing essentially $R^1 SiO_{3/2}$ units and/or $SiO_{4/2}$ units, and (E) an inorganic filler.

2. The epoxy resin composition of claim 1, wherein the zinc molybdate content of the inorganic carrier and zinc molybdate component amounts to 5 to 40% by weight.

3. The epoxy resin composition of claim 1, wherein 1 to 120 parts by weight of the zinc molybdate on inorganic carrier is present per 100 parts by weight of components (A) and (B) combined.

4. The epoxy resin composition of claim 1, wherein the 0.1 to 8 parts by weight of the organosilicon compound (D-i) is present per 100 parts by weight of components (A) and (B) combined.

5. The epoxy resin composition of claim 1, wherein the amount of phenolic hydroxyl groups in curing agent (B) is from 0.5 to 1.5 moles per mole of epoxy groups in epoxy resin (A).

6. The epoxy resin composition of claim 2, wherein the zinc molybdate on inorganic carrier has a zinc molybdate content of 10 to 30% by weight.

7. The epoxy resin composition of claim 1, wherein the amount of silicon compound (D-i) is 0.2 to 4 parts by weight of the epoxy resin (A) and the curing agent (B) combined.

8. The epoxy resin composition of claim 1, wherein the inorganic filler (E) is a spherical fused silica having a mean particle diameter of 1 to 40 μm.

9. A semiconductor device encapsulated with a cured product of the epoxy resin composition of any one of claims 1, 2 to 4, or 5, to 8.

* * * * *